US010988845B2

(12) United States Patent
Ko et al.

(10) Patent No.: US 10,988,845 B2
(45) Date of Patent: Apr. 27, 2021

(54) PLATED STEEL SHEET HAVING MULTILAYER STRUCTURE AND MANUFACTURING METHOD THEREFOR

(71) Applicant: POSCO, Pohang-si (KR)

(72) Inventors: Kyoung-Pil Ko, Gwangyang-si (KR); Kyung-Hoon Nam, Gwangyang-si (KR); Tae-Yeob Kim, Gwangyang-si (KR); Dong-Yoeul Lee, Gwangyang-si (KR); Yong-Hwa Jung, Gwangyang-si (KR); Woo-Sung Jung, Gwangyang-si (KR)

(73) Assignee: POSCO, Pohang-si (KR)

( * ) Notice: Subject to any disclaimer, the term of this patent is extended or adjusted under 35 U.S.C. 154(b) by 0 days.

(21) Appl. No.: 16/469,980

(22) PCT Filed: Dec. 21, 2017

(86) PCT No.: PCT/KR2017/015275
§ 371 (c)(1),
(2) Date: Jun. 14, 2019

(87) PCT Pub. No.: WO2018/117701
PCT Pub. Date: Jun. 28, 2018

(65) Prior Publication Data
US 2020/0080205 A1 Mar. 12, 2020

(30) Foreign Application Priority Data

Dec. 22, 2016 (KR) .................. 10-2016-0177198

(51) Int. Cl.
*C23C 14/16* (2006.01)
*C23C 14/24* (2006.01)
(Continued)

(52) U.S. Cl.
CPC .......... *C23C 28/025* (2013.01); *B32B 15/013* (2013.01); *B32B 15/04* (2013.01);
(Continued)

(58) Field of Classification Search
CPC .... C25D 3/22; C23C 2/02; C23C 2/40; C23C 2/06; C23C 2/28; C23C 2/26;
(Continued)

(56) References Cited

U.S. PATENT DOCUMENTS 5,648,177 A 7/1997 Fukui et al.
5,747,111 A * 5/1998 Fukui .................... C23C 14/024
427/250
(Continued)

FOREIGN PATENT DOCUMENTS

CN 1070932 9/2001
CN 101636517 1/2010
(Continued)

OTHER PUBLICATIONS

Machine Translation, Sakamoto, et al., JP 10-317125, Dec. 1998. (Year: 1998).*
(Continued)

*Primary Examiner* — Michael E. La Villa
(74) *Attorney, Agent, or Firm* — Cantor Colburn LLP

(57) ABSTRACT

Provided is a plated steel sheet often used as materials for vehicles, home appliances, construction and the like and, more specifically, to a plated steel sheet having a multilayer structure and a method for manufacturing the same.

8 Claims, 2 Drawing Sheets

(51) Int. Cl.

| | | |
|---|---|---|
| *C23C 28/02* | (2006.01) | |
| *C23C 2/06* | (2006.01) | |
| *B32B 15/01* | (2006.01) | |
| *C25D 3/00* | (2006.01) | |
| *C23C 2/02* | (2006.01) | |
| *C23C 2/40* | (2006.01) | |
| *C23C 14/54* | (2006.01) | |
| *B32B 15/04* | (2006.01) | |
| *C23C 2/26* | (2006.01) | |
| *C23C 14/02* | (2006.01) | |
| *C23C 14/00* | (2006.01) | |
| *C23C 14/58* | (2006.01) | |
| *B32B 15/18* | (2006.01) | |
| *C23C 18/00* | (2006.01) | |
| *C23C 2/28* | (2006.01) | |
| *C23C 14/34* | (2006.01) | |
| *C23C 30/00* | (2006.01) | |
| *C25D 3/22* | (2006.01) | |

(52) U.S. Cl.
 CPC .......... *B32B 15/043* (2013.01); *B32B 15/18* (2013.01); *C23C 2/02* (2013.01); *C23C 2/06* (2013.01); *C23C 2/26* (2013.01); *C23C 2/28* (2013.01); *C23C 2/40* (2013.01); *C23C 14/00* (2013.01); *C23C 14/02* (2013.01); *C23C 14/024* (2013.01); *C23C 14/025* (2013.01); *C23C 14/16* (2013.01); *C23C 14/24* (2013.01); *C23C 14/34* (2013.01); *C23C 14/54* (2013.01); *C23C 14/541* (2013.01); *C23C 14/5806* (2013.01); *C23C 18/00* (2013.01); *C23C 28/02* (2013.01); *C23C 28/021* (2013.01); *C23C 28/023* (2013.01); *C23C 28/026* (2013.01); *C23C 28/028* (2013.01); *C23C 30/00* (2013.01); *C23C 30/005* (2013.01); *C25D 3/22* (2013.01); *Y10T 428/12729* (2015.01); *Y10T 428/12785* (2015.01); *Y10T 428/12792* (2015.01); *Y10T 428/12799* (2015.01); *Y10T 428/12972* (2015.01); *Y10T 428/12979* (2015.01); *Y10T 428/2495* (2015.01); *Y10T 428/24967* (2015.01); *Y10T 428/24975* (2015.01); *Y10T 428/263* (2015.01); *Y10T 428/264* (2015.01); *Y10T 428/265* (2015.01)

(58) Field of Classification Search
 CPC ..... C23C 28/02; C23C 28/025; C23C 28/021; C23C 28/026; C23C 28/023; C23C 28/028; C23C 14/541; C23C 14/54; C23C 14/16; C23C 14/24; C23C 14/025; C23C 14/5806; C23C 14/00; C23C 14/02; C23C 14/024; C23C 14/34; C23C 18/00; C23C 30/00; C23C 30/005; B32B 15/013; B32B 15/04; B32B 15/043; B32B 15/18; Y10T 428/12785; Y10T 428/12792; Y10T 428/12729; Y10T 428/12799; Y10T 428/12972; Y10T 428/12979; Y10T 428/2495; Y10T 428/24967; Y10T 428/24975; Y10T 428/263; Y10T 428/264; Y10T 428/265

See application file for complete search history.

(56) References Cited

U.S. PATENT DOCUMENTS

| | | |
|---|---|---|
| 2010/0013612 A1 | 1/2010 | Tokuda et al. |
| 2013/0186524 A1 | 7/2013 | Kwak et al. |
| 2015/0352812 A1 | 12/2015 | Jung et al. |
| 2017/0350029 A1 | 12/2017 | Hong et al. |

FOREIGN PATENT DOCUMENTS

| | | | |
|---|---|---|---|
| CN | 103282534 | | 9/2013 |
| CN | 104903493 | | 9/2015 |
| JP | 03087381 | | 4/1991 |
| JP | 07157867 | | 6/1995 |
| JP | 08081761 | | 3/1996 |
| JP | 09137267 | | 5/1997 |
| JP | 09228030 | | 9/1997 |
| JP | 09241828 | | 9/1997 |
| JP | 10-317125 | * | 12/1998 |
| JP | 2005146340 | | 6/2005 |
| JP | 2016503837 | | 2/2016 |
| KR | 20120074145 | | 7/2012 |
| KR | 20120075196 | | 7/2012 |
| KR | 20140081623 | | 7/2014 |
| KR | 20160077455 | | 7/2016 |

OTHER PUBLICATIONS

Translation, Sakamato, et al., JP 10-317125, Dec. 1998. (Year: 1998).*
International Search Report—PCT/KR2017/015275 dated Mar. 30, 2018.
European Search Report—European Application No. 17885343.8, dated Nov. 4, 2019, citing EP 2 940 191, JP 09 137267, JP 07 157867 and JP 03 87381.
Chinese Office Action—Chinese Application No. 201780080312.X dated Oct. 10, 2020, citing JP H09-137267, CN 101636517, CN 104903493, JP H03-087381, JP H07-157867, JP H10-317125, CN 1070932, KR 10-2012-0074145, KR 10-2012-0075196, CN 103282534, and KR 10-2014-0081623.

* cited by examiner (a)  (b)

(a)  (b)

PLATED STEEL SHEET HAVING MULTILAYER STRUCTURE AND MANUFACTURING METHOD THEREFOR

TECHNICAL FIELD

The present disclosure relates to a plated steel sheet commonly used as a material for vehicles, home appliances, construction and the like and, more specifically, to a plated steel sheet having a multilayer structure and a method for manufacturing the same.

BACKGROUND ART

A surface of a steel sheet product used as a material of vehicles, home appliances, constructional materials, and the like, may be zinc-plated by a method such as an electroplating method, a hot-dip plating method, or the like, to improve corrosion resistance and durability. As such a zinc-plating processed product may have significantly improved corrosion resistance by sacrificial protection of zinc as compared to a general steel sheet product on which the zinc plating process is not performed, the zinc-plating processed product has been widely applied in overall industries.

However, recently, as demand for a lightweight and economical plating product having further improved corrosion resistance has been increased in relevant industrial fields, the development of a technique corresponding to the demand has also been actively conducted. Further, as a price of zinc, a main resource of a plating layer of the zinc plated steel sheet, has rapidly increased, there have been continuous research for reducing an amount of coating by reducing a content of zinc or for replacing zinc with another element.

A technique for reducing an amount of coating of a plating steel sheet has been suggested. However, as an amount of coating is a factor which may greatly affect corrosion prevention and long-term rust prevention of a metal, and the more the amount of coating increases, the more the time for red rust to be generated may increase, accordingly, corrosion resistance may increase. Thus, an amount of coating has not been decreased due to the problem of degradation of corrosion resistance.

Meanwhile, various studies into an alloy using zinc combined with other materials have been conducted. As a representative research, as a Zn—Mg alloy plating process has more improved corrosion resistance as compared to a zinc (Zn) plating process, various products have been developed including a third element such as Zn—Mg alloy or a Zn—Mg—X (X=Al, Ni, Cr, Pb, Cu, and the like) alloy.

However, in the case of a Zn—Mg alloy plating process, an overall formed phase may be intermetallic compounds such as Mg2Zn11, MgZn2, MgZn, Mg7Zn3, and the like, which may have very brittle properties as compared to Zn or Mg. Accordingly, a plurality of cracks or peel-off may occur in a stage of processing a steel sheet such that it may be impossible to substantially apply the technique. In other words, as a Zn—Mg alloy plating process has stiff and easily breakable properties as compared to a pure zinc plating process, even when a steel sheet is slightly deformed, cracks may be created on a plating layer such that the plating layer may be easily separated, and plating adhesion force may significantly degrade, which may be disadvantageous.

Also, as Mg included in a Zn—Mg plating layer is highly active, a black staining phenomenon in which a surface of a produce reacts with moisture in a wet atmosphere such that the surface is blackened may occur, which may degrade quality of a product. To prevent the black staining phenomenon, reference 1 and 2 have been suggested.

(Reference 1) Japanese Laid-Open Patent Publication Doku Kai Hei No. 9-241828
(Reference 2) Japanese Laid-Open Patent Publication Doku Kai No. 2005-146340

DISCLOSURE

Technical Problem

An aspect of the present disclosure is to provide a plating steel sheet having a Zn/Mn/Zn multilayer structure which may have a plating layer having excellent corrosion resistance, which may have excellent black staining resistance, preventing a black staining phenomenon on a surface, and which may have a plating layer having excellent adhesion force, and a method of manufacturing the same.

The problem which the present discourse aims to address are not limited to the above-mentioned problems, and other unmentioned problems may be explicitly understood for a person having ordinary skill in the art based on the descriptions below.

Technical Solution

According to an aspect of the present disclosure, a plating steel sheet having a multilayer structure is provided, the plating steel sheet including a base steel sheet; a first Zn layer formed on the base steel sheet; a second Mg layer formed on the first Zn layer; and a third Zn layer formed on the second Mg layer, and the second Mg layer is an amorphous phase.

According to another aspect of the present disclosure, a method of manufacturing a plating steel sheet having a multilayer structure is provided, the method including preparing a base steel sheet; forming a first Zn layer on the base steel sheet; forming a second Mg layer on the first Zn layer; and forming a third Zn layer on the second Mg layer, and the second Mg layer and the third Zn layer are formed by a vacuum evaporation method, and a temperature of the base steel sheet is 50 to 120° C.

Advantageous Effects

According to an aspect of the present disclosure, a multilayer plating steel sheet having a Zn/Mg/Zn structure which may have excellent corrosion resistance and may have excellent plating adhesion properties, and in which a surface black staining phenomenon does not occur, and a method of manufacturing the same may be provided.

BEST MODE FOR INVENTION

In the description below, the present disclosure will be described in detail.

In the example embodiment of the present disclosure, a multilayer structure including a first Zn layer, a second Mg layer, and a third Zn layer may be formed on a surface of a base steel sheet, a thickness of each layer may be controlled, diffusion of the third Zn layer into the second Mg layer may be adjusted, corrosion resistance may improve through amorphization of the second Mg layer, plating adhesion force may be secured by preventing the formation of a crystalized Zn—Mg alloy layer, and a black staining phenomenon may be prevented by additionally coating an upper Zn layer.

A multilayer plating steel sheet of the present disclosure will be described in detail. The multilayer plating steel sheet may include a first Zn layer formed on a base steel sheet, a second Mg layer formed on the first Zn layer, and a third Zn layer formed on the second Mg layer.

A type of the base steel sheet may not be particularly limited, and any base steel sheet used in the technical field of the present disclosure, such as a hot-rolled steel sheet, a cold-rolled steel sheet, and the like, may be used.

The first Zn layer may be formed on the base steel sheet. The first Zn layer may be formed by a hot-dip zinc plating method, an electro-zinc plating method, a vacuum evaporation method, and the like. A composition of a plating layer of the first Zn layer may not be particularly limited, and a general plating layer composition formed by a hot-dip zinc plating method, an electro-zinc plating method, a vacuum evaporation method, and the like, may be applied.

A preferable thickness of the first Zn layer may be 1 to 3 μm. When a thickness of the first Zn layer is less than 1 μm, a deviation of a plated thickness may increase depending on roughness of a base iron such that a plating effect may decrease. Meanwhile, corrosion resistance of an overall plating steel sheet having a multilayer structure of the present disclosure may be highly dependent on the second Mg layer. When a thickness of the first Zn layer exceeds 3 μm, although an effect of improving corrosion resistance may not be significant, time and costs may increase such that there may be the problem of inefficiency.

The second Mg layer may be formed on the first Zn layer, and the third Zn layer may be formed on the second Mg layer. It may be preferable to form the second Mg layer and the third Zn layer by a vacuum evaporation method using a pure Mg metal and a pure Zn metal, respectively.

Figure 1:
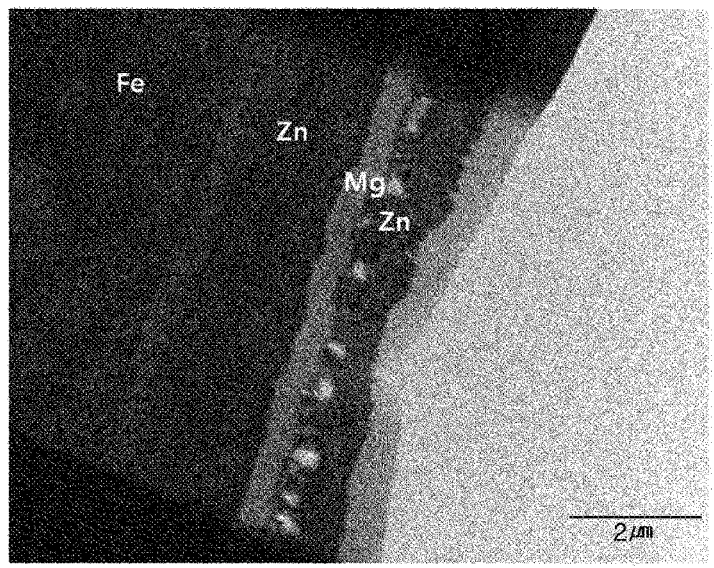
FIG. 1 is an TEM image showing a Zn/Mg/Zn multilayer plating steel sheet according to an example embodiment of the present disclosure.
Figure 2:
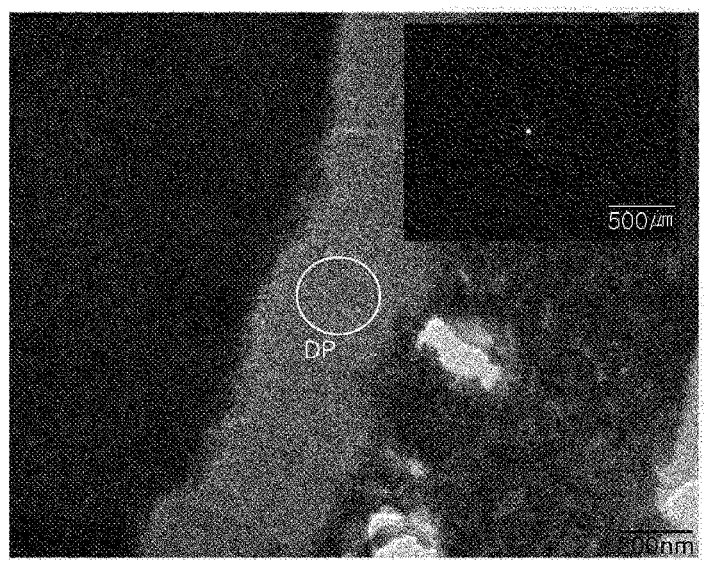
FIG. 2 is an image obtained by imaging a TEM diffractive pattern of a second Mg layer in a Zn/Mg/Zn multilayer plating steel sheet according to an example embodiment of the present disclosure.

An internal portion of the second Mg layer may include a solid solution phase in which Zn, diffused from the third Zn layer, is mixed. As Zn is diffused, an Mg crystal structure may change, and as a result, the second Mg layer may include lattice distortion such that normal crystallization may not occur. Also, diffused Zn may interfere with growth of Mg gains such that, consequently, the second Mg layer may grow to an amorphous phase. Whether the second Mg layer is an amorphous phase may be identified using a TEM (transmission electron microscope). In other words, as illustrated in FIG. 2, in the second Mg layer, a diffractive pattern did not have a spot formed pattern indicating a crystalline structure, which indicates that the second Mg layer grew to an amorphous phase.

The second Mg layer may be an amorphous phase, and may include a Zn—Mg amorphous or a Zn—Mg alloy phase having a nanocrystal form, which may have a fine form formed as Mg reacts with diffused Zn. As a nanocrystal Zn—Mg alloy phase has a maximum size of several tens of nm, the nanocrystal Zn—Mg alloy phase may appear as an amorphous phase even when being observed using an XRD (X-ray diffraction) or a TEM, differently from a general crystallized alloy phase. In other words, the amorphous second Mg layer may have a structure in which a Zn—Mg amorphous or a Zn—Mg alloy phase having a nanocrystal form is partially occupied.

A Zn—Mg amorphous or a Zn—Mg alloy phase having a nanocrystal form may have a synergetic effect along with improvement of corrosion resistance and amorphization of the second Mg layer in the second Mg layer. Generally, an amorphous form may have lower conductivity than that of a crystalline form as the amorphous form has increased resistivity, and accordingly, an electrical chemical reaction may not occur, and higher resistance against corrosion may be implemented. Thus, a Zn—Mg amorphous phase may significantly contribute to corrosion resistance as an alloy phase along with an amorphous effect. Also, a nanocrystal Zn—Mg alloy phase, formed by diffused Zn alloyed in a fine region in nanometer unit in the second Mg layer, may not have corrosion resistance as much as that of $Mg_xZn_y$ in which an overall coating layer is formed of an alloy phase, but at least, corrosion resistance may further improve than in the case in which the phase is formed of pure Mg or pure Zn.

A content of Zn included in a Zn—Mg amorphous phase or a Zn—Mg alloy phase having a nanocrystal form in the second Mg layer, formed by Zn diffused into the second Mg layer, may be 20 to 60 wt % preferably. When 20 wt % or less of Zn is diffused, Zn may not greatly affect growth of Mg, and Mg lattice deformation may also not be significant, such that amorphization may not smoothly occur. Also, when a content of diffused Zn exceeds 60 wt %, Zn may be largely diffused as Zn is greatly affected by a substrate temperature, and as the substrate temperature increases, diffused Zn may be alloyed with a portion of Mg by thermal driving force such that a crystallized Zn—Mg alloy phase may be partially formed. Such a Zn—Mg alloy phase may be formed of a crystal phase, not an amorphous phase, and may be a region having high brittleness as described in the background above such that the Zn—Mg alloy phase may adversely affect plating adhesion properties and may cause a black staining phenomenon simultaneously. Thus, a preferable maximum content of Zn diffused in the second Mg layer may be 60 wt %.

A thickness of the second Mg layer may be 0.5 to 1.5 μm. When a thickness of the second Mg layer is less than 0.5 μm, even when amorphization and the formation of a nanocrystal Zn—Mg alloy phase occurs by diffusion of Zn in the second Mg layer, corrosion resistance may not significantly improve as a thickness is low. When the thickness exceeds 1.5 μm, a thickness may be beyond a level in which Zn is able to be diffused, and a coating layer section formed of pure Mg may increase such that an unnecessary coating layer which may not contribute to improvement of corrosion resistance may be formed, which may not be economical. Further, when the third Zn layer is coated, a black staining phenomenon may occur as time passes.

The third Zn layer may supply Zn diffusible into the second Mg layer as described above and may also work as a protective film or a barrier layer which may prevent a black staining phenomenon when a surface of the second Mg layer is exposed. A thickness of the third Zn layer may be 1 to 3 μm. When a thickness of the third Zn layer is less than 1 μm, the coated Zn layer for preventing a black staining phenomenon of the second Mg layer may not sufficiently block intrusion of external moisture into a plating film such that it may be difficult to expect sufficient black staining resistance. When the thickness exceeds 3 µm, the effect of improving black staining resistance may not further increase such that an unnecessary plating film layer be formed, which may not be economical.

In the description below, a method of manufacturing a multilayer plating steel sheet will be described in detail. The method of manufacturing a multilayer plating steel sheet of the present disclosure may include preparing a base steel sheet, forming a first Zn layer on the base steel sheet, forming a second Mg layer on the first Zn layer, and forming a third Zn layer on the second Mg layer.

The preparing the base steel sheet may include a process of removing a thin oxide film (scale) of a nanometer level formed on a surface of the base steel sheet. A method of removing the oxide film may not be particularly limited. As an example, the oxide film may be removed by a plasma etching method using an ion beam. A plating layer may be formed on a surface of the base steel sheet from which the oxide film is removed as above.

A method of forming the first Zn layer on the base steel sheet may not be particularly limited as described above, and may be formed by a method such as a hot-dip zinc plating method, an electro-zinc plating method, a vacuum evaporation method, and the like. A composition of a plating layer of the first Zn layer may not be particularly limited, and may be implemented by a general Zn plating process using a hot-dip zinc plating process, an electro-zinc plating process, and a vacuum evaporation process.

It may be preferable to form the second Mg layer and the third Zn layer using a pure Mg metal and a pure Zn metal, respectively. In this case, it may be preferable to remove foreign objects or a natural oxide film on a surface using plasma, an ion beam, and the like. As the vacuum evaporation method, an electron beam method, a sputtering method, a thermal vaporization method, an induction heat vaporization method, an ion plating method, and the like, may be applied. Preferably, a high speed evaporation may be used to improve a production speed, and it may be preferable to form the second Mg layer and the third Zn layer by an electromagnetic levitation induction heat method having an electromagnetic stirring effect.

When the second Mg layer and the third Zn layer are vacuum-evaporated, a preferable temperature of the base steel sheet may be 50 to 120° C. When a temperature of the base steel sheet increases, atoms of the evaporated material may actively move, and a degree of diffusion movement of the material may increase. When a temperature of the base steel sheet is 50° C. or higher, Zn atoms of the third Zn layer may be actively diffused into the second Mg layer, but when the temperature exceeds 120° C., diffused Zn atoms and Mg atoms in the second Mg layer may be started being alloyed such that a crystalized Zn—Mg alloy layer may be partially formed.

The formation of a Zn—Mg alloy layer may have an effect of significantly improving corrosion resistance, but the greater the alloy region, the higher the ratio of an alloy phase having high brittleness, such that a plating layer may be separated during processing, and plating adhesion properties may be deteriorated. For this reason, a preferable temperature of the base steel sheet may be 50 to 120° C.

When the second Mg layer and the third Zn layer are vacuum-evaporated, a preferable degree of vacuum in a chamber may be $1\times10^{-5}$ to $1\times10^{-2}$ mbar. When the degree of vacuum is maintained as above, an increase of brittleness or a decrease of properties caused by the formation of an oxide may be prevented during forming a thin film.

MODE FOR INVENTION

In the description below, an embodiment of the present disclosure will be described in detail. The below embodiment is provided for understanding of the present disclosure, and will not limit the present disclosure.

Embodiment 1

As a base steel sheet, a general cold-rolled steel sheet was prepared, and a first Zn layer was formed by a general electro-zinc plating method.

The base steel sheet was charged into a vacuum chamber, foreign objects and a natural oxide film on a surface were removed through a plasma pretreatment, and a second Mg layer and a third Zn layer were formed using an electromagnetic levitation induction heat method. A thickness of each layer and a temperature during the evaporation were listed in Table 1. During vacuum-evaporating the second Mg layer and the third Zn layer, a degree of vacuum in the chamber was maintained between $2\times10^{-2}$ to $9\times10^{-4}$ mbar approximately.

Blackening resistance, plating adhesion force, corrosion resistance, and the like, of the multilayer plating steel sheet manufactured as above were tested, and the results were listed in Table 1.

In the blackening resistance test, a color difference between before and after a plating steel sheet was maintained in a temperature and humidity maintaining device of which a temperature is 50° C. and relative humidity is 95% for 72 hours was determined by the naked eye.

O: no color change, X: surface blackening occurred

Plating adhesion force was tested using a generally used OT bending test. In the test, whether separation occurred was tested, and a phase of a thin film was analyzed using an XRD analysis. The analysis of the thin film was conducted for an overall plating layer structure, and the term. "Zn+Mg" in Table 1 indicates the analysis result in which a Zn crystal phase appearing on the first Zn layer and the third Zn layer, and an Mg crystal phase formed by the non-amorphous second Mg layer were obtained simultaneously. Meanwhile, the term "Zn" indicates that a crystal phase of Mg was not observed by an XRD as the second Mg layer became amorphous, and thus that only an Zn crystal phase obtained in the first Zn layer and the third Zn layer was analyzed.

Lastly, in the corrosion resistance test, a salt spray test was performed under 5% NaCl condition, a temperature of 35° C., and a spraying pressure of 1 kg/cm², and the time in which 5% of red rust was created was measured. The result determination reference for the corrosion test was as below.
120 hours or longer: OK, less than 120 hours: NG Also, as a thickness of the third Zn layer was excessively increased, plating adhesion properties was relatively deteriorated.

TABLE 1

| Classification | Thickness of Coating Layer (μm) | | | Substrate Temperature | Blackening Resistance | Plating Adhesion Properties (Separation/ No Separation) | Corrosion Resistance | Phase Analysis |
|---|---|---|---|---|---|---|---|---|
| | First Zn Layer | Second Mg Layer | Third Zn Layer | | | | | |
| Comparative Example 1 | 2 | 0.5 | — | — | x | No Separation | NG | Zn + Mg |
| Comparative Example 2 | 2 | 1 | — | — | x | No Separation | NG | Zn + Mg |
| Comparative Example 3 | 2 | 2 | — | — | x | No Separation | NG | Zn + Mg |
| Inventive Example 1 | 2 | 0.5 | 1 | 80 | ○ | No Separation | OK | Zn |
| Inventive Example 2 | 2 | 1 | 1 | 80 | ○ | No Separation | OK | Zn |
| Inventive Example 3 | 2 | 1.5 | 1 | 80 | ○ | No Separation | OK | Zn |
| Comparative Example 4 | 2 | 2 | 1 | 80 | ○ | No Separation | OK | Zn + Mg |
| Comparative Example 5 | 2 | 1 | 0.5 | 80 | ○ | No Separation | NG | Zn + Mg |
| Inventive Example 4 | 2 | 1 | 1 | 80 | ○ | No Separation | OK | Zn |
| Inventive Example 5 | 2 | 1 | 3 | 80 | ○ | No Separation | OK | Zn |
| Comparative Example 6 | 2 | 1 | 5 | 80 | ○ | Separation | OK | Zn |
| Inventive Example 6 | 1 | 1 | 1 | 80 | ○ | No Separation | OK | Zn |
| Inventive Example 7 | 3 | 1 | 1 | 80 | ○ | No Separation | OK | Zn |
| Comparative Example 7 | 5 | 1 | 1 | 80 | ○ | No Separation | OK | Zn |

As for inventive examples 1 to 7 satisfying the conditions of the present disclosure, a plating steel sheet having excellent black staining resistance and excellent plating adhesion properties and corrosion resistance was able to be economically manufactured.

In comparative examples 1 to 3, the third Zn layer was not formed, and only a two layer structure formed of the first Zn layer and the second Mg layer was formed, a single Zn phase and a single Mg phase formed each layer such that the corrosion resistance was very low, and as an upper portion was covered by an Mg layer, a black staining phenomenon significantly occurred.

As for comparative example 4, by diffusion of the third Zn layer, corrosion resistance improved as the second Mg layer was amorphous, and amorphous or nanocrystal Zn—Mg alloying was performed in a fine region in the second Mg layer, but a thickness of the Mg layer was beyond the present disclosure, and the Mg layer was present as an unnecessary coating layer region, which was not economical.

As for comparative example 5, a thickness of the coated third Zn layer was less than the condition suggested in the present disclosure such that a range of a content of diffusible Zn decreased. Accordingly, an amount of Zn diffused into the second Mg layer was low, and Mg and a partial Zn—Mg amorphous and nanocrystal Zn—Mg alloy phase were decreased such that corrosion resistance was deteriorated.

As for comparative example 6, a thickness of the coated third Zn layer was greater than the thickness suggested in the present disclosure, which was not significantly effective to improve corrosion resistance and was thus not economical.

As for comparative example 7, a thickness of the coated first Zn layer was greater than the thickness suggested in the present disclosure such that the effect of properties improvement aimed in the present disclosure was insignificant, and the thickness included an economically unnecessary coating layer.

Embodiment 2

Under the same conditions as those of embodiment 1, the first Zn layer, the second Mg layer, and the third Zn layer were manufactured with thicknesses of 1, 1, and 3 μm, respectively. However, a degree of Zn diffusion of the third Zn layer was adjusted by controlling a temperature of the substrate during a vacuum evaporation of the second Mg layer and the third Zn layer differently, to be up to 160° C., and a plating steel sheet was manufactured.

Analysis of black staining resistance, plating adhesion force, corrosion resistance, and phases, of the multilayer plating steel sheet manufactured as above were conducted by the method as in embodiment 1, and the results were listed in Table 2. Also, a weight ratio Zn diffused into the second Mg layer was analyzed through a TEM-EDS dot analysis on a cross-sectional portion of the second Mg layer, and the result was listed in Table 2 as well.

TABLE 2

| Classification | Substrate Temperature | Weight Ratio of Zn of Second Mg Layer | Black Staining Resistance | Plating Adhesion Properties (Separation/No Separation) | Corrosion Resistance | Phase Analysis |
|---|---|---|---|---|---|---|
| Comparative Example 8 | Room Temperature | 0 | x | No Separation | NG | Zn + Mg |
| Comparative Example 9 | 30 | <10 | x | No Separation | NG | Zn + Mg |
| Inventive Example 8 | 50 | 20 | x | No Separation | OK | Zn |
| Inventive Example 9 | 80 | 20~40 | x | No Separation | OK | Zn |
| Inventive Example 10 | 120 | 30~60 | x | No Separation | OK | Zn |
| Comparative Example 10 | 160 | 5~60 | o | Separation | OK | Zn + $Mg_2Zn_{11}$ |

Inventive examples 8 to 10 satisfying the conditions of the present disclosure had excellent black staining resistance, plating adhesion properties, and corrosion resistance.

As for comparative example 8, as Zn was not diffused at all on the third Zn layer during coating the second Zn layer and the third Mg layer without a separate heating process, the coating layers were formed individually, and corrosion resistance was significantly degraded. In comparative example 9, as the heating temperature was 30° C., a degree of diffusion of Zn in the third Zn layer was low, and an amount of Zn in the second Mg layer was less than several %, such that the Mg layer also included a crystalized Mg phase, and accordingly, amorphization rarely occurred, which caused the degradation of corrosion resistance.

Comparative example 10 was heated at 160° C., diffusion of Zn in the third Zn layer was sufficiently performed, and a temperature range in which alloying occurred was implemented, such that Mg in the second Mg layer and diffused Zn was alloyed, and a Zn—Mg alloy phase was partially formed. A Zn—Mg alloy phase was observed as an Mg2Zn11 phase as a result of an XRD measurement. Accordingly, corrosion resistance was sufficiently implemented by the formation of the crystallized alloy phase, but as inherent brittleness of a Zn—Mg alloy phase increased, a separation phenomenon partially occurred in an aspect of plating adhesion properties.

Figure 3:
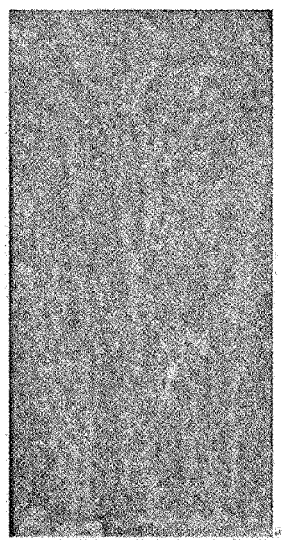
FIG. 3 is images of examination of corrosion resistance of (a) inventive example 8 and (b) comparative example 8, respectively.
Figure 3:
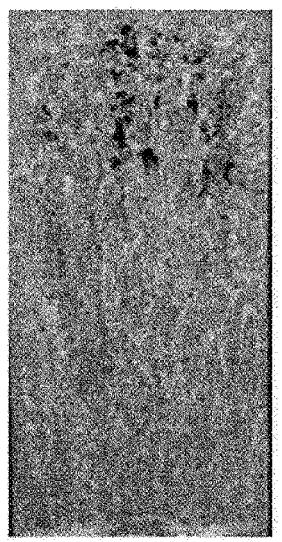
Figure 4:
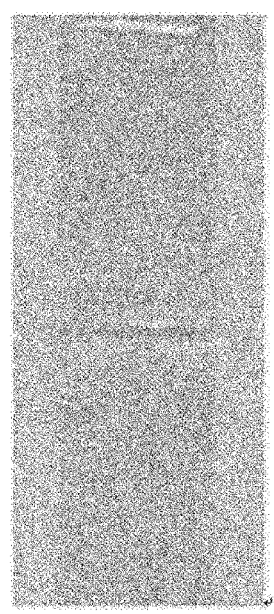
FIG. 4 is images of an OT bending test of (a) inventive example 8 and (b) comparative example 10, respectively.
Figure 4:
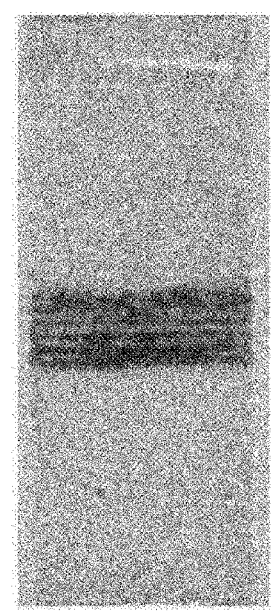

FIGS. 3 (a) and (b) are images obtained by observing red rust creation on a surface after a corrosion resistance test of inventive example 8 and comparative example 8, respectively. As illustrated in FIG. 3, red rust was not created in the inventive example (a), whereas in comparative example (b), red rust was created. Also, FIGS. 4 (a) and (b) are images of results of an OT bending test of inventive example 8 and comparative example 10, respectively. Plating film separation was insignificant in inventive example (a), whereas in comparative example (b), plating film separation greatly occurred.

The invention claimed is:

1. A plating steel sheet having a multilayer structure, comprising:
a base steel sheet;
a first Zn layer formed on the base steel sheet;
a second Zn—Mg layer formed on the first Zn layer; and
a third Zn layer formed on the second Zn—Mg layer,
wherein the second Zn—Mg layer comprises: one or more of a Zn—Mg amorphous phase and a Zn—Mg alloy phase having a nanocrystalline form.

2. The plating steel sheet of claim 1, wherein a content of Zn included in the Zn—Mg amorphous phase and the Zn—Mg alloy phase having a nanocrystalline form is 20 to 60 wt %.

3. The plating steel sheet of claim 1, wherein a thickness of the first Zn layer is 1 to 3 μm.

4. The plating steel sheet of claim 1, wherein a thickness of the second Zn—Mg layer is 0.5 to 1.5 μm.

5. The plating steel sheet of claim 1, wherein a thickness of the third Zn layer is 1 to 3 μm.

6. A method of manufacturing a plating steel sheet having a multilayer structure, the method comprising:
preparing a base steel sheet;
forming a first Zn layer on the base steel sheet;
heating the base steel to a temperature of 50 to 120° C.,
vacuum-evaporating Mg on the first Zn layer to form a Mg-evaporated layer; and
vacuum-evaporating Zn on the Mg-evaporated layer in order for the Zn to be diffused into the Mg-evaporated layer to form one or more of a Zn—Mg amorphous phase and a Zn—Mg alloy phase having a nanocrystalline form.

7. The method of claim 6, wherein the forming of the first Zn layer is performed by one of a hot-dip plating method, an electroplating method, and a vacuum evaporation method.

8. The method of claim 6, wherein a degree of vacuum of a chamber during the vacuum evaporation of the second Mg layer and the third Zn layer is $1\times10^{-5}$ to $1\times10^{-2}$ mbar.

* * * * *